(12) United States Patent
Lee

(10) Patent No.: US 8,502,256 B2
(45) Date of Patent: Aug. 6, 2013

(54) LIGHT EMITTING DIODE AND METHOD FOR MANUFACTURE OF THE SAME

(75) Inventor: Sang Youl Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/308,146

(22) Filed: Nov. 30, 2011

(65) Prior Publication Data

US 2012/0074382 A1  Mar. 29, 2012

Related U.S. Application Data

(63) Continuation of application No. 12/438,808, filed on Feb. 25, 2009, now Pat. No. 8,404,566.

(30) Foreign Application Priority Data

Sep. 25, 2006 (KR) .................. 10-2006-0092732

(51) Int. Cl.
*H01L 33/00* (2010.01)

(52) U.S. Cl.
USPC ............... 257/98; 438/33; 252/E33.062

(58) Field of Classification Search
USPC ......................... 438/33, 40; 257/98
See application file for complete search history.

(56) References Cited

U.S. PATENT DOCUMENTS

| | | | |
|---|---|---|---|
| 5,316,967 A | 5/1994 | Kaneno et al. | |
| 5,619,520 A | 4/1997 | Sasai et al. | |
| 6,482,666 B1 * | 11/2002 | Kobayashi et al. | 438/33 |
| 6,515,309 B1 * | 2/2003 | Tohyama et al. | 257/88 |
| 6,784,460 B2 | 8/2004 | Ng et al. | |
| 6,946,788 B2 | 9/2005 | Suehiro et al. | |
| 7,012,012 B2 | 3/2006 | Yeom et al. | |
| 7,183,136 B2 | 2/2007 | Hashimura et al. | |
| 7,268,371 B2 | 9/2007 | Krames et al. | |
| 7,785,908 B2 | 8/2010 | Yoo | |
| 8,076,680 B2 * | 12/2011 | Lee et al. | 257/88 |
| 2003/0190770 A1 | 10/2003 | Yeom et al. | |
| 2004/0009649 A1 | 1/2004 | Kub et al. | |
| 2004/0065882 A1 | 4/2004 | Yamazaki et al. | |
| 2005/0070095 A1 | 3/2005 | Sharan et al. | |
| 2005/0077537 A1 * | 4/2005 | Seong et al. | 257/103 |

(Continued)

FOREIGN PATENT DOCUMENTS

CN   1484328 A   3/2004
JP   11-317546 A   11/1999

(Continued)

OTHER PUBLICATIONS

English language translation of JP2005-191252 published Jul. 14, 2005.

(Continued)

*Primary Examiner* — Julio J Maldonado
*Assistant Examiner* — Sonya D McCall Shepard
(74) *Attorney, Agent, or Firm* — Birch, Stewart, Kolasch & Birch, LLP

(57) ABSTRACT

Disclosed is a light emitting device. The light emitting device includes a substrate, a semiconductor layer on the substrate, and an electrode on the semiconductor layer, wherein the substrate has at least one side surface having a predetermined tilt angle with respect to a bottom surface of the substrate, wherein the predetermined tilt angle is an obtuse angle, and wherein a side surface of the semiconductor layer disposes vertically.

20 Claims, 5 Drawing Sheets

U.S. PATENT DOCUMENTS

| | | |
|---|---|---|
| 2005/0186760 A1 | 8/2005 | Hashimura et al. |
| 2007/0164292 A1 | 7/2007 | Okuyama |
| 2007/0171531 A1 | 7/2007 | Nakamura |
| 2007/0196946 A1 | 8/2007 | Kasai et al. |
| 2008/0268558 A1 | 10/2008 | Sugawara et al. |
| 2009/0127578 A1 * | 5/2009 | Masuya ........................... 257/98 |
| 2009/0279278 A1 | 11/2009 | Tsujimura et al. |

FOREIGN PATENT DOCUMENTS

| | | |
|---|---|---|
| JP | 2003-023176 A | 1/2003 |
| JP | 2003-298108 A | 10/2003 |
| JP | 2005-191252 A | 7/2005 |
| JP | 2006-019586 A | 1/2006 |
| KR | 1999-006588 A | 1/1999 |
| KR | 10-2004-0000355 A | 1/2004 |
| KR | 10-2004-0063128 A | 7/2004 |
| KR | 10-2005-0104151 A | 11/2005 |
| WO | WO2004/017432 * | 2/2004 |

OTHER PUBLICATIONS

English language translation of JP2006-019586 published Jan. 1, 2006.

English language translation of KR10-2005-0104151 published Nov. 2, 1995.

* cited by examiner

LIGHT EMITTING DIODE AND METHOD FOR MANUFACTURE OF THE SAME

CROSS-REFERENCE TO RELATED APPLICATIONS

This application is a continuation of U.S. application Ser. No. 12/438,808 filed on Feb. 25, 2009 now U.S. Pat. No. 8,404,566, which claims priority under 35 U.S.C. 119(a) to Korean Patent Application No. 10-2006-0092732 (filed on Sep. 25, 2006), which are hereby incorporated by reference in their entireties.

TECHNICAL FIELD

Embodiments relate to a light emitting diode and a method for manufacturing the same.

BACKGROUND ART

Light emitting diodes (LEDs) are manufactured through a scribing process of separating a plurality of unit chips after forming a compound semiconductor on the substrate.

The scribing process is to irradiate laser onto a substrate or a compound semiconductor. The substrate or the compound semiconductor, which is adjacent to a scribing region irradiated with the laser, may be damaged during the laser irradiation.

A portion of light generated from an active layer of the LED is emitted to the outside through the scribing region. However, it is difficult for light to pass through a portion of the substrate or the compound semiconductor damaged by the laser, which degrades light efficiency of the LED after all.

DISCLOSURE

Technical Problem

Embodiments provide a light emitting diode (LED) and a method for manufacturing the same.

Embodiments provide an LED with improved light efficiency and a method for manufacturing the same.

Technical Solution

An embodiment provides a method for manufacturing a light emitting diode (LED), comprising: forming a semiconductor layer; forming a mask layer on the semiconductor layer; irradiating laser onto a scribing region of the mask layer to divide the semiconductor layer into a plurality of light emitting diodes; etching the scribing region; removing the mask layer; and separating the plurality of light emitting diodes.

An embodiment provides a method for manufacturing a light emitting diode, comprising: forming a semiconductor layer on a substrate; forming a mask layer on the semiconductor layer; irradiating laser onto a scribing region of the substrate to divide the substrate into a plurality of light emitting diodes; etching the scribing region; removing the mask layer; and separating the plurality of light emitting diodes.

An embodiment provides a light emitting diode comprising: a substrate; a semiconductor layer on the substrate; and an electrode on the semiconductor layer, wherein the substrate or the semiconductor layer has at least one etched side surface having a predetermined tilt angle.

The details of one or more embodiments are set forth in the accompanying drawings and the description below. Other features will be apparent from the description and drawings, and from the claims.

Advantageous Effects

Embodiments can provide a light emitting diode (LED) and a method for manufacturing the same.

Embodiments can provide an LED with improved light efficiency and a method for manufacturing the same.

MODE FOR INVENTION

Reference will now be made in detail to a light emitting diode (LED) and a method for manufacturing the same, examples of which are illustrated in the accompanying drawings.

FIGS. 1 to 6 are sectional views illustrating an LED and a method for manufacturing the same according to a first embodiment.

Figure 1:
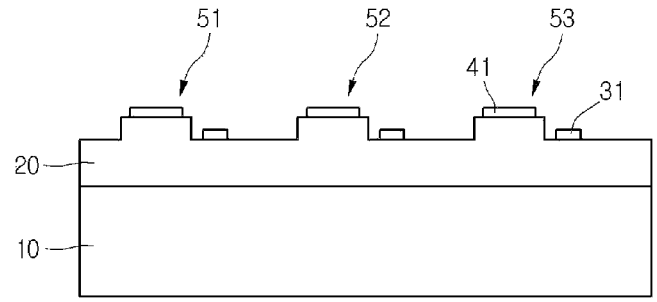
FIGS. 1 to 6 are sectional views illustrating a light emitting diode (LED) and a method for manufacturing the same according to a first embodiment.

Referring to FIG. 1, a semiconductor layer 20, a first electrode 31 and a second electrode 41 are formed on a substrate 10 so as to form an LED.

The substrate 10 may include, for example, a sapphire substrate. The semiconductor layer 20 has a multi-stacked structure of a compound semiconductor, which will be more fully described in FIG. 6 later.

A portion of the semiconductor layer 20 may be selectively etched, and the first electrode 31 is formed on an etched portion of the semiconductor layer 20. Accordingly, heights of the first and second electrodes 31 and 41 differ from each other even though they are formed on the same semiconductor layer 20.

The embodiment of FIGS. 1 to 6 illustrates sectional views for convenience in description, which illustrate processes of forming first, second and third LEDs 51, 52 and 53.

Figure 2:
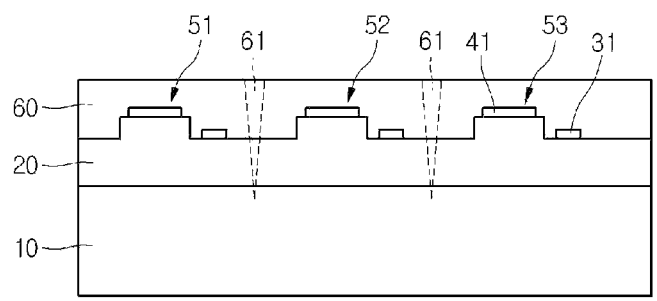

Referring to FIG. 2, a mask layer 60 is formed on the semiconductor layer 20, the first electrode 31 and the second electrode 41.

The mask layer 60 protects the semiconductor layer 20 during a scribing process, and is formed of a material which can be wet-etched or dry-etched. A material for used in the mask layer 60 will be described in detail later.

In FIG. 2, reference numeral 61 denotes a scribing region. In this embodiment, laser is irradiated onto the scribing region 61 using a laser irradiation apparatus, thus dividing the semiconductor layer 20 into the first, second and third LEDs 51, 52 and 53.

Figure 3:
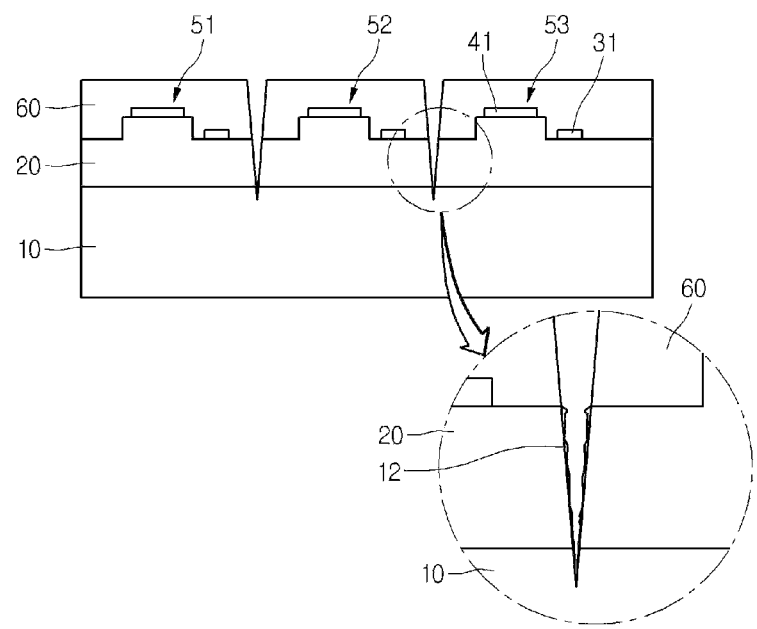

Referring to FIG. 3, when the laser is irradiated onto the scribing region 61, the mask layer 60, the semiconductor layer 20 and the substrate 10 in the scribing region 61 are removed.

During laser irradiation, the layers in the scribing region 61 onto which the laser is irradiated are damaged, causing a damaged region 12 with a rugged surface to be formed, as illustrated in FIG. 3.

The light emitted from the active layer of the LED does not pass through but is absorbed at the damaged region 12, and thus the damaged region 12 is removed so as to improve light efficiency of the LED in this embodiment.

The removal of the damaged region 12 may be performed using wet etching or dry etching process.

The wet etching process is performed using a first etchant including at least one of hydrochloric acid (HCl), nitric acid ($HNO_3$), potassium hydroxide (KOH), sodium hydroxide (NaOH), sulfuric acid ($H_2SO_4$), phosphoric acid ($H_3PO_4$) and aluetch ($4H_3PO_4+4CH_3COOH+HNO_3$). A temperature of the first etchant is between 200° C. and 400° C.

The mask layer 60 prevents the semiconductor layer 20 from being etched during the etching of the damaged region 12. The mask layer 60 may be formed of, for example, silicon nitride ($Si_3N_4$) or an oxide-based material such as silicon oxide ($SiO_2$), which is hardly etched by the first etchant.

That is, the first etchant has a higher etch selectivity to the damaged region 12 than to the mask layer 60.

Since the mask layer 60 is hardly etched by the first etchant, the damaged region 12 can be selectively etched while minimizing the etch amount of the semiconductor layer 20.

The dry etching may be performed through an inductively coupled plasma/reactive ions etcher (ICP/RIE) or an RIE. In addition, the dry etching may be performed using a first etching gas including at least one of $BCl_3$, $Cl_2$, HBr and Ar.

The mask layer 60 configured to prevent the semiconductor layer 20 from being etched during the etching of the damaged region 12 may be formed of an oxide-based material such as $SiO_2$, $TiO_2$ and ITO or a metallic material such as Cr, Ti, Al, Au, Ni and Pt, which is hardly etched by the first etching gas.

That is, the first etching gas has a higher etch selectivity to the damaged region 12 than to the mask layer 60.

Figure 4:
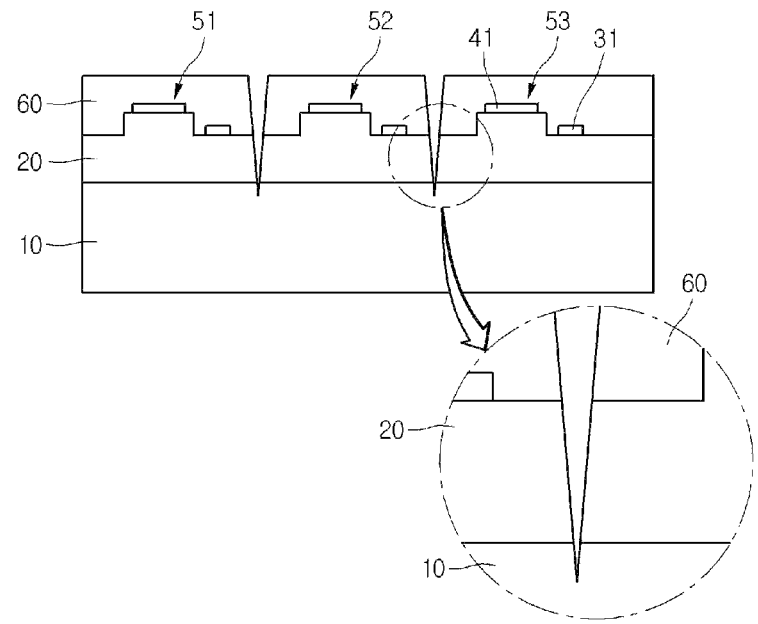

The wet etching and the dry etching may be performed for several minutes to several tens of minutes depending on etching environments. FIG. 4 illustrates that the damaged region 12 of the scribing region 61 is removed.

Figure 5:
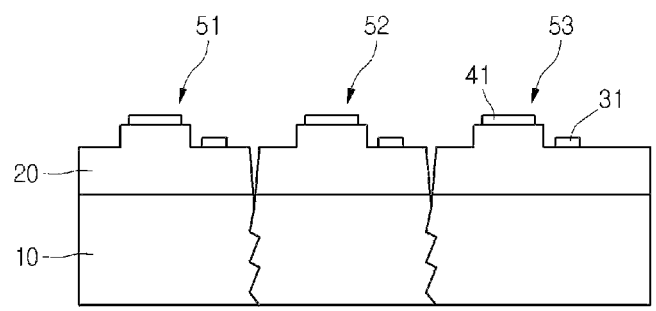

Referring to FIG. 5, the mask layer 60 formed on the semiconductor layer 20 is removed after the removal of the damaged region 12.

The removal of the mask layer 60 may be performed using at least one of the wet etching and the dry etching.

For example, the mask layer 60 is removed through the wet etching using a second etchant including at least one of buffer oxide etchant (BOE) or hydrofluoric acid (HF).

Because the semiconductor layer 20 is hardly etched by the second etchant, the mask layer 60 can be selectively etched while minimizing the etch amount of the semiconductor layer 20.

That is, the second etchant has a higher etch selectivity to the mask layer 60 than to the semiconductor layer 20.

For example, the mask layer 60 is removed through the dry etching using a second etching gas including at least one of $O_2$ and $CF_4$.

The mask layer 60 can be selectively etched while minimizing the etch amount of the semiconductor layer 20 because the semiconductor layer 20 is hardly etched by the second etching gas.

That is, the second etching gas has a higher etch selectivity to the mask layer 60 than to the semiconductor layer 20.

Thereafter, a physical impact is applied to the substrate 10 and the semiconductor layer 20, so that the first LED 51, the second LED 52 and the third LED 53 are separated from each other by the scribing region 61.

A lapping process may be performed to reduce the thickness of the substrate 10 before applying the physical impact to the substrate 10 and the semiconductor layer 20. The lapping process may be performed through at least one process of chemical mechanical polishing (CMP), dry etching, wet etching and mechanical polishing using slurry.

Figure 6:
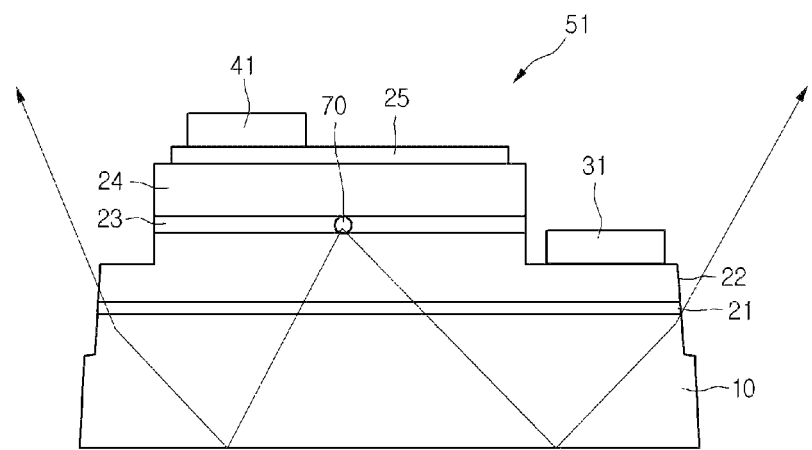

FIG. 6 illustrates the first LED 51 separated by the scribing region.

The first LED 51 includes the semiconductor layer 20, the first electrode 31 and the second electrode 41 which are formed over the substrate 10.

The semiconductor layer 20 includes a buffer layer 21, an n-type semiconductor layer 22, an active layer 23, a p-type semiconductor layer 24 and a transparent electrode layer 25.

The buffer layer 21 relieves stress between the substrate 10 and the n-type semiconductor layer 22 and enables the semiconductor layer to easily grow. The buffer layer 21 may have at least one structure of AlInN/GaN, $In_xGa_{1-x}$N/GaN and $Al_xIn_yGa_{1-x-y}$N/$In_xGa_{1-x}$N/GaN.

The n-type semiconductor layer 22 may include a GaN layer doped with silicon, and may be formed by supplying silane gas containing n-type dopant such as $NH_3$, trimethylgallium (TMGa) and Si.

The active layer 23 may have a single-quantum well or a multi-quantum well (MQW) structure formed of InGaN/GaN. The p-type semiconductor layer 24 may be formed of trimethylaluminum (TMAl), bis(ethylcyclopentadienyl) magnesium (EtCp2Mg), or ammonia ($NH_3$).

The transparent electrode layer 25 is formed of a material such as ITO, ZnO, RuOx, TiOx and IrOx. The first electrode 31 may be formed of titanium (Ti) and the second electrode 41 may be formed of a metallic material such as nickel (Ni).

The first LED 51 emits light from the active layer 23 when a power is supplied to the first and second electrodes 31 and 41.

In FIG. 6, a point light source 70 is exemplarily illustrated. A portion of the light emitted from the point light source 70 is reflected by the substrate 10 and emitted to the outside through sides of the first LED 51.

Since the damaged region 12 on the sides of the first LED 51 has been removed through the wet etching or the dry etching, the light is scarcely absorbed at the sides of the first LED 51, and thus it is possible to effectively emit the light to the outside.

FIGS. 7 to 11 are sectional views illustrating an LED and a method for manufacturing the same according to a second embodiment.

Figure 7:
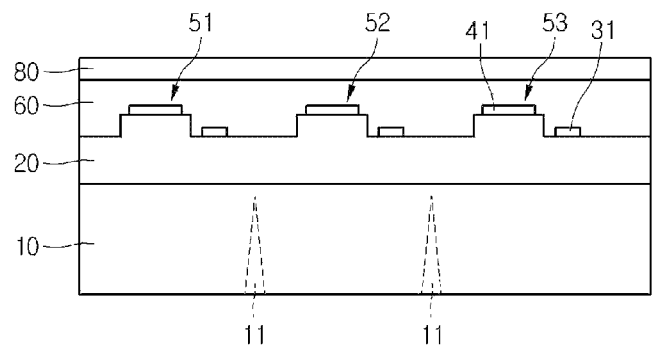
FIGS. 7 to 11 are sectional views illustrating an LED and a method for manufacturing the same according to a second embodiment.

Referring to FIG. 7, a semiconductor layer 20, a first electrode 31 and a second electrode 41 are formed on a substrate 10 so as to form an LED. In addition, a mask layer 60 and a support member 80 are formed on the semiconductor layer and the first and second electrodes 31 and 41.

The substrate 10 may include, for example, a sapphire substrate. The semiconductor layer 20 has a multi-stacked structure of a compound semiconductor.

A portion of the semiconductor layer 20 may be selectively etched, and the first electrode 31 is formed on the etched portion of semiconductor layer 20. Accordingly, heights of the first and second electrodes 31 and 41 differ from each other even though they are formed on the same semiconductor layer 20.

The embodiment of FIGS. 7 to 11 illustrates sectional views for convenience in description, which illustrate processes of forming first, second and third LEDs 51, 52 and 53.

The mask layer 60 protects the semiconductor layer 20 during a scribing process, and is formed of a material which can be wet-etched or dry-etched.

The support member 80 prevents damages of the first, second and third LEDs 51, 52 and 53 which may be caused by a physical force applied to the first, second and third LEDs 51, 52 and 53 while laser is irradiated onto the substrate 10 using a laser irradiation apparatus and then the damaged region of the substrate 10 due to the laser irradiation is removed by wet or dry etching.

Further, the support member 80 prevents the separation of the first, second and third LEDs 51, 52 and 53 caused by external impact before a process of separating the first, second and third LEDs 51, 52 and 53 is completed.

The support member 80 may be formed of at least one of an adhesive tape, a material which can be wet-etched or dry-etched, a metallic material and a wafer substrate.

The support member 80 may be selectively formed depending on thicknesses of the substrate 10 and the semiconductor layer 20. Thus, the support member 80 may be omitted.

In FIG. 7, reference numeral 11 denotes a scribing region. In second embodiment, laser is irradiated onto the scribing region 11 using a laser irradiation apparatus, thus dividing the substrate 10 into the first, second and third LEDs 51, 52 and 53.

A lapping process may be performed to reduce the thickness of the substrate 10 before irradiating the laser onto the scribing region 11. The lapping process may be performed through at least one process of chemical mechanical polishing (CMP), dry etching, wet etching and mechanical polishing using slurry.

Figure 8:
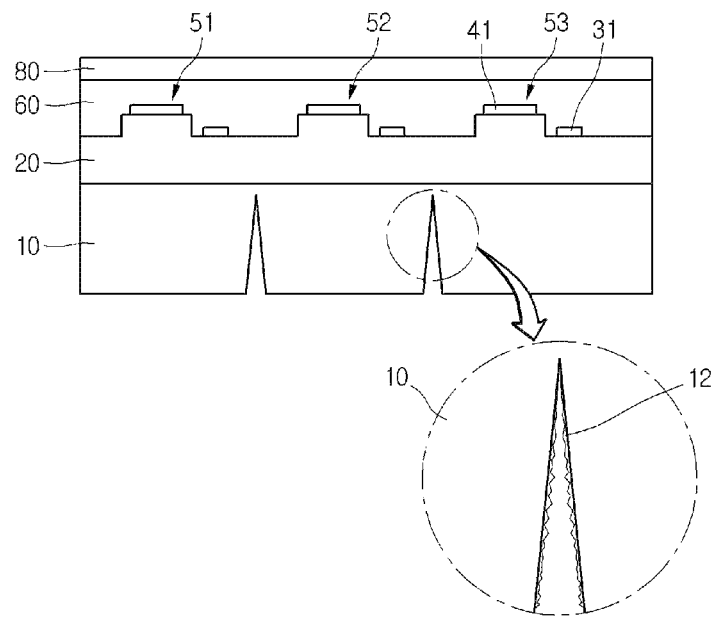

Referring to FIG. 8, when the laser is irradiated onto the scribing region 11, the substrate 10 of the scribing region 11 is selectively removed.

During laser irradiation, the layers in the scribing region 11 onto which the laser is irradiated are damaged, causing a damaged region 12 with a rugged surface to be formed, as illustrated in FIG. 8.

The light emitted from the active layer of the LED does not pass through but is absorbed at the damaged region 12, and thus the damaged region 12 is removed so as to improve light efficiency of the LED in this embodiment.

The removal of the damaged region 12 may be performed using a wet etching or dry etching process.

The wet etching process may be performed using a first etchant including at least one of hydrochloric acid (HCl), nitric acid ($HNO_3$), potassium hydroxide (KOH), sodium hydroxide (NaOH), sulfuric acid ($H_2SO_4$), phosphoric acid ($H_3PO_4$) and aluetch ($4H_3PO_4+4CH_3COOH+HNO_3$). A temperature of the first etchant is between 200° C. and 400° C.

The mask layer 60 prevents the semiconductor layer 20 from being etched during the etching of the damaged region 12. The mask layer 60 may be formed of, for example, silicon nitride ($Si_3N_4$) or an oxide-based material such as silicon oxide ($SiO_2$), which is hardly etched by the first etchant.

Since the mask layer 60 is hardly etched by the first etchant, the damaged region 12 can be selectively etched while minimizing the etch amount of the semiconductor layer 20.

The dry etching may be performed using an ICP/RIE or an RIE. In addition, the dry etching may be performed using a first etching gas including at least one of $BCl_3$, $Cl_2$, HBr and Ar.

The mask layer 60 configured to prevent the semiconductor layer 20 from being etched during the etching of the damaged region 12 may be formed of an oxide-based material such as $SiO_2$, $TiO_2$ and ITO or a metallic material such as Cr, Ti, Al, Au, Ni and Pt, which is hardly etched by the first etching gas.

Figure 9:
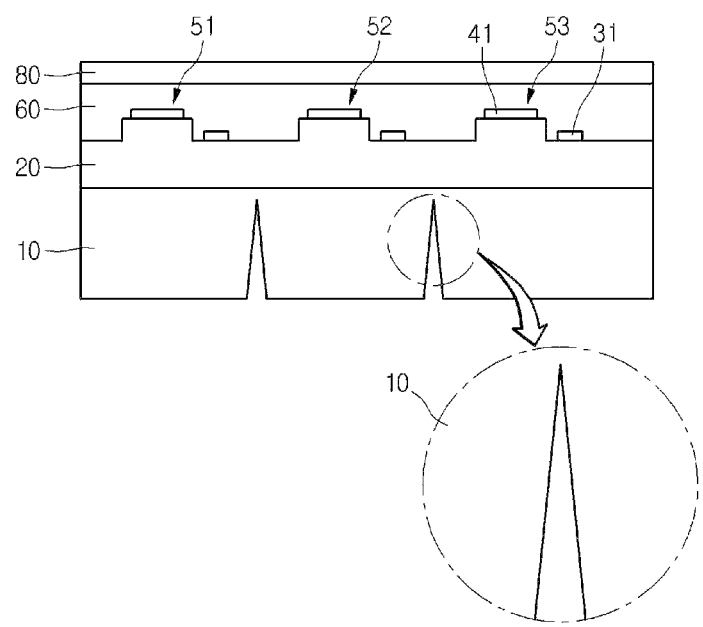
Figure 10:
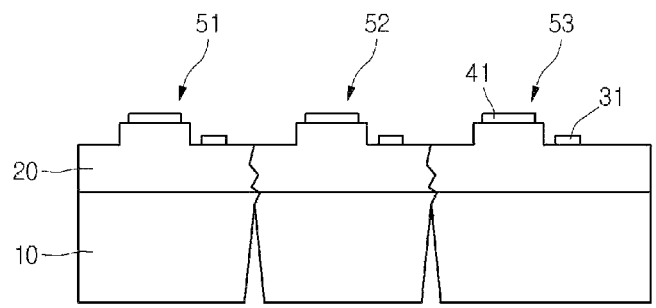

The wet etching and the dry etching may be performed for several minutes to several tens of minutes depending on etching environments. FIG. 9 illustrates that the damaged region 12 of the scribing region 11 is removed.

Referring to FIG. 9, the mask layer 60 and the support member 80 formed on the semiconductor layer 20 are removed after the removal of the damaged region 12.

The support member 80 may be differently removed depending on kinds of the support member 80. For example, the support member 80 formed of adhesive tape is removed by detaching it, whereas the support member 80 formed of an etchable material is removed by etching process.

The removal of the mask layer 60 may be performed using at least one method of the wet etching and the dry etching.

For example, the mask layer 60 is removed through the wet etching process using a second etchant including at least one of buffer oxide etchant (BOE) or hydrofluoric acid (HF).

Because the semiconductor layer 20 is hardly etched by the second etchant, the mask layer 60 can be selectively etched while minimizing the etch amount of the semiconductor layer 20.

For example, the mask layer 60 is removed by the dry etching using a second etching gas including at least one of $O_2$ and $CF_4$.

The mask layer 60 can be selectively etched while minimizing the etch amount of the semiconductor layer 20 because the semiconductor layer 20 is hardly etched by the second etching gas.

Thereafter, a physical impact is applied to the substrate 10 and the semiconductor layer 20, and thus the first LED 51, the second LED 52 and the third LED 53 are separated from each other by the scribing region 11.

Figure 11:
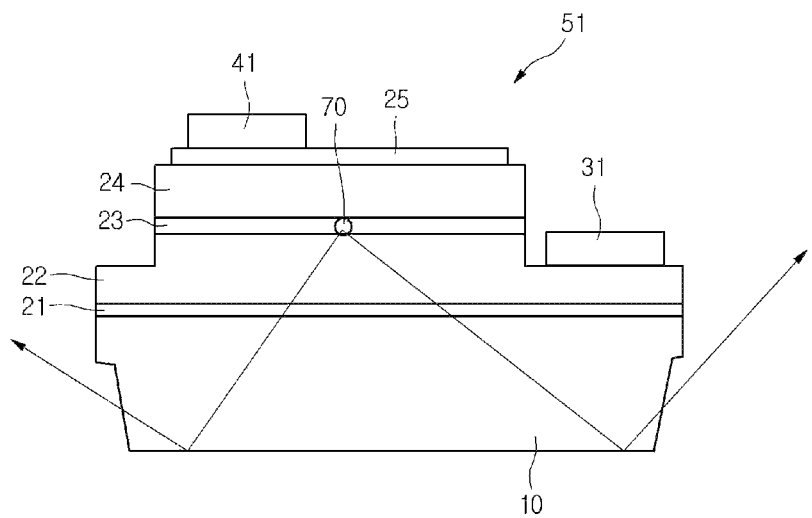

FIG. 11 illustrates the first LED 51 separated by the scribing region 11.

The first LED 51 includes the semiconductor layer 20, the first electrode 31 and the second electrode 41 which are formed over the substrate 10.

The semiconductor layer 20 includes a buffer layer 21, an n-type semiconductor layer 22, an active layer 23, a p-type semiconductor layer 24 and a transparent electrode layer 25.

The buffer layer 21 relieves stress between the substrate 10 and the n-type semiconductor layer 22 and enables the semiconductor layer to easily grow. The buffer layer 21 may have at least one structure of AlInN/GaN, $In_xGa_{1-x}$N/GaN and $Al_xIn_yGa_{1-x-y}$N/$In_xGa_{1-x}$N/GaN.

The n-type semiconductor layer 22 may include a GaN layer doped with silicon, and may be formed by supplying silane gas containing n-type dopant such as $NH_3$, TMGa and Si.

The active layer 23 may have a single-quantum well or a multi-quantum well (MQW) structure formed of InGaN/GaN. The p-type semiconductor layer 24 may be formed of trimethylaluminum (TMAL), bis(ethylcyclopentadienyl) magnesium (EtCp2Mg), or ammonia ($NH_3$).

The transparent electrode layer is formed of a material such as ITO, ZnO, RuOx, TiOx and IrOx. The first electrode 31 may be formed of titanium (Ti) and the second electrode 41 may be formed of a metallic material such as nickel (Ni).

The first LED 51 emits light from the active layer 23 when a power is supplied to the first and second electrodes 31 and 41.

In FIG. 11, a point light source 70 is exemplarily illustrated. A portion of the light emitted from the point light source 70 is reflected by the substrate 10 and emitted to the outside through sides of the first LED 51.

In the LED and the method for manufacturing the same according to the embodiments, the LED having a PN junction is described, which includes the n-type semiconductor layer, the active layer and the p-type semiconductor layer. However, a chip separation process according to the embodiments is also available for an LED having a NPN junction where an n-type semiconductor layer, an active layer, a p-type semiconductor layer and an n-type semiconductor layer are stacked in sequence.

Further, in the LED and the method for manufacturing the same according to the embodiments, the chip separation process of an LED having a horizontal configuration is described, in which the first electrode is formed on the n-type semiconductor layer and the second electrode is formed on the p-type semiconductor layer after the p-type semiconductor layer, the active layer and the n-type semiconductor layer are partially removed.

However, the chip separation process is also available for an LED having a vertical configuration in which the substrate including a conductive substrate, the first electrode, the n-type semiconductor layer, the active layer, the p-type semiconductor layer and the second electrode are sequentially formed, that is, the first electrode is formed between the semiconductor layer and the substrate and the second electrode is formed on the semiconductor layer, respectively, Any reference in this specification to "a first embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Also, it will be understood that when an element is referred to as being 'on' or 'under' another element, it can be directly on/under the element, and one or more intervening elements may also be present.

INDUSTRIAL APPLICABILITY

A light emitting diode (LED) and a method for manufacturing the same according to the embodiments can be applied to a separation process of LEDs having a variety of structures.

The invention claimed is:

1. A semiconductor light emitting device comprising:
a substrate comprising a top surface and a bottom surface;
a light emitting structure on the substrate, disposing closer to the substrate top surface than the substrate bottom surface, and comprising an n-type conductive type semiconductor layer, a p-type conductive type semiconductor layer on the n-type conductive type semiconductor layer, and an active layer between the n-type and p-type conductive type semiconductor layers;
a transparent electrode layer on the p-type conductive type semiconductor layer;
a first electrode disposed on the n-type conductive type semiconductor layer; and
a second electrode disposed on and contacting to the transparent electrode layer,
wherein the substrate has side surfaces extending from the substrate bottom surface to the substrate top surface, the side surfaces inclined outwardly as the substrate extends in a direction from the substrate bottom surface to the substrate top surface,
wherein the transparent electrode layer covers more than 50% of a total area of a top surface of the p-type conductive type semiconductor layer, and
wherein a part of light generated by the light emitting structure is emitted to outside via the transparent electrode layer.

2. The semiconductor light emitting device in claim 1, wherein a width of the substrate top surface is greater than a width of the substrate bottom surface, and
wherein a portion of the substrate top surface extends beyond the substrate bottom surface.

3. The semiconductor light emitting device in claim 1, further comprising a buffer layer between the substrate and the n-type conductive type semiconductor layer.

4. The semiconductor light emitting device in claim 1, wherein the active layer comprises at least one of single-quantum well and a multi-quantum well structure comprising of InGaN/GaN.

5. The semiconductor light emitting device in claim 1, wherein the n-type conductive type semiconductor layer comprises a GaN layer.

6. The semiconductor light emitting device in claim 3, wherein the buffer layer comprises at least one stacked structure of AlInN/GaN, $In_xGa_{1-x}N/GaN$, or $Al_xIn_yGa_{1-x-y}N/In_xGa_{1-x}N/GaN$.

7. The semiconductor light emitting device in claim 1, the transparent electrode layer comprises at least one of ITO, ZnO, RuOx, TiOx, or IrOx.

8. The semiconductor light emitting device in claim 1, wherein the first electrode comprises titanium (Ti).

9. The semiconductor light emitting device in claim 1, wherein the second electrode comprises metallic material.

10. A semiconductor light emitting device, comprising:
a substrate;
a semiconductor layer on the substrate, the semiconductor layer comprising a first semiconductor layer, an active layer on the first semiconductor layer, and a second semiconductor layer on the active layer;
a transparent electrode layer including ITO on the second semiconductor layer;
a first electrode disposed on the first semiconductor layer; and
a second electrode disposed on and contacting to the transparent electrode layer,
wherein the substrate has at least one side surface having a predetermined tilt angle, wherein the predetermined tilt angle is an obtuse angle with respect to a bottom surface of the substrate,
wherein a part of the side surface of the substrate has a step part, and
wherein the step part extends outwardly as the substrate extends in a direction from the bottom surface of the substrate to a top surface of the substrate.

11. The semiconductor light emitting device in claim 10, wherein the active layer comprises at least one of single-quantum well and a multi-quantum well structure comprising of InGaN/GaN.

12. The semiconductor light emitting device in claim 10, wherein the first electrode comprises titanium (Ti).

13. The semiconductor light emitting device in claim 10, wherein the first conductive type semiconductor layer comprises a GaN layer.

14. The semiconductor light emitting device in claim 1, wherein the second electrode comprises nickel (Ni).

15. The semiconductor light emitting device in claim 1, wherein the side surfaces include a tilt angle and a step part having an angle different from the tilt angle.

16. The semiconductor light emitting device in claim 15, wherein a length from the step part to the top surface is less than a length from the step part to the bottom surface of the substrate.

17. The semiconductor light emitting device in claim 1, wherein the substrate includes a break portion between the top surface and the bottom surface of the substrate.

18. The semiconductor light emitting device in claim 1, wherein a length of the p-type conductive type semiconductor layer is less than a length of the bottom surface of the substrate.

19. The semiconductor light emitting device in claim 10, wherein the second electrode comprises nickel (Ni).

20. A semiconductor light emitting device comprising:

a substrate comprising a top surface and an bottom surface;

a light emitting structure on the substrate, disposing closer to the top surface than the bottom surface, and comprising an n-type conductive type semiconductor layer, a p-type conductive type semiconductor layer on the n-type conductive type semiconductor layer, and an active layer between the n-type and p-type conductive type semiconductor layers;

a transparent electrode layer on the p-type conductive type semiconductor layer;

a first electrode disposed on the n-type conductive type semiconductor layer; and a second electrode disposed on and contacting to the transparent electrode layer, wherein a diagonal line from one corner to another corner of the top surface of the substrate is longer than a diagonal line from one corner to another corner of the bottom surface of the substrate, wherein the substrate comprises a first side surface and a second side surface, the first side surface and the second side surface having inclined surfaces, wherein a part of at least one of the first side surface or the second side surface of the substrate has a step part, and wherein the transparent electrode layer covers more than 50% of a total area of top surface of the p-type conductive type semiconductor layer.

\* \* \* \* \*